(12) United States Patent
Ikegame et al.

(10) Patent No.: US 8,703,398 B2
(45) Date of Patent: Apr. 22, 2014

(54) METHOD OF MANUFACTURING LIQUID EJECTION HEAD

(71) Applicant: Canon Kabushiki Kaisha, Tokyo (JP)

(72) Inventors: Ken Ikegame, Atsugi (JP); Isamu Horiuchi, Yokohama (JP); Hyo Takahashi, Kunitachi (JP); Takuma Kodoi, Kawasaki (JP); Yasunori Takei, Tokyo (JP); Kenji Yabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/796,000

(22) Filed: Mar. 12, 2013

(65) Prior Publication Data

US 2013/0266901 A1    Oct. 10, 2013

(30) Foreign Application Priority Data

Apr. 6, 2012   (JP) .................................. 2012-087360

(51) Int. Cl.
*B41J 2/16*    (2006.01)
(52) U.S. Cl.
USPC ............................ 430/320; 430/330; 430/394

(58) Field of Classification Search
None
See application file for complete search history.

(56) References Cited

U.S. PATENT DOCUMENTS

| 5,225,935 A * | 7/1993 | Watanabe et al. ............. 359/619 |
| 7,585,616 B2 | 9/2009 | Shaarawi et al. |
| 2012/0047736 A1* | 3/2012 | Horiuchi ...................... 29/890.1 |

\* cited by examiner

*Primary Examiner* — John A. McPherson
(74) *Attorney, Agent, or Firm* — Fitzpatrick, Cella, Harper & Scinto

(57) ABSTRACT

The manufacturing method includes forming, on a surface of a negative photosensitive resin layer formed on a substrate, a hollow having inclinations at both sides in a cross section taken along a plane perpendicular to a row direction of the ejection orifice, and then forming a latent image in the hollow, thereby forming the ejection orifice so that an angle between a side surface portion thereof and a normal to the outer opening in a cross section of the ejection orifice taken along a plane which passes through a center of the ejection orifice and is perpendicular to the row direction is larger than an angle between the side surface portion and the normal to the outer opening in a cross section of the ejection orifice taken along a plane which includes a center line of the ejection orifice in the row direction and is perpendicular to a substrate surface.

12 Claims, 7 Drawing Sheets

METHOD OF MANUFACTURING LIQUID EJECTION HEAD

BACKGROUND OF THE INVENTION

1. Field of the Invention

The present invention relates to a method of manufacturing a liquid ejection head.

2. Description of the Related Art

In recent years, a liquid ejection head (hereinafter also referred simply to as "head") is demanded to perform printing in higher image quality. As a method of realizing printing in higher image quality, there are known a method of minimizing the diameter of an ejection orifice of the head, and a method of arranging the ink ejection orifices in higher density. When printing is performed with use of a head having the ejection orifices arranged in higher density, energy is input simultaneously to a larger number of heaters. Therefore, a larger amount of heat is generated in the head, and the generated heat is liable to be stored in the head. The storage of heat in the head may cause change in ejection characteristics such as an ejection amount, and further may influence the high image quality printing in some cases. As a countermeasure, there is known a method of decreasing the flow resistance from the heater to an upper opening of the ejection orifice, to thereby reduce the input energy.

As one example of the method of decreasing the flow resistance from the heater to the upper opening of the ejection orifice, there is known a method described in U.S. Pat. No. 7,585,616. In a head described in U.S. Pat. No. 7,585,616, the ejection orifice provided in a flow path forming member includes an upper ejection orifice and a lower ejection orifice which communicate to each other, and the lower ejection orifice has a tapered shape in which across-sectional area decreases toward the upper ejection orifice.

SUMMARY OF THE INVENTION

According to an aspect of the present invention, there is provided a method of manufacturing a liquid ejection head, the liquid ejection head including: a substrate including, at a first surface side thereof, a plurality of ejection energy generating elements for generating energy for ejecting liquid droplets; and a flow path forming member provided at the first surface side of the substrate, the flow path forming member forming a plurality of ejection orifices for ejecting the liquid droplets, the plurality of ejection energy generating elements being arranged in at least one row at the first surface side of the substrate, the plurality of ejection orifices being formed at positions corresponding to the plurality of ejection energy generating elements, respectively, the plurality of ejection orifices each having a tapered shape in which a cross-sectional area thereof decreases from an inner opening toward an outer opening, the method including, in the following order: (1) disposing a negative resist on or above the substrate to form a negative photosensitive resin layer; (2) forming, on or above a surface of the negative photosensitive resin layer, a hollow having inclinations at both sides in a cross section taken along a plane perpendicular to a row direction of the plurality of ejection orifices; (3) performing exposure treatment to form a latent image of each of the plurality of ejection orifices in the hollow, the latent image being formed of an unexposed portion; and (4) performing development treatment to remove the unexposed portion, to thereby form the each of the plurality of ejection orifices, in which the latent image has a front surface portion disposed in the hollow so that an end portion of the front surface portion of the latent image is positioned in the inclinations at the both sides, and in which an angle between a side surface portion of the latent image and a normal to the front surface portion in a cross section of the latent image taken along a plane which passes through a center of the latent image and is perpendicular to the row direction is larger than an angle between the side surface portion and the normal to the front surface portion in a cross section of the latent image taken along a plane which includes a center line of the latent image in the row direction and is perpendicular to a substrate surface.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 5A:
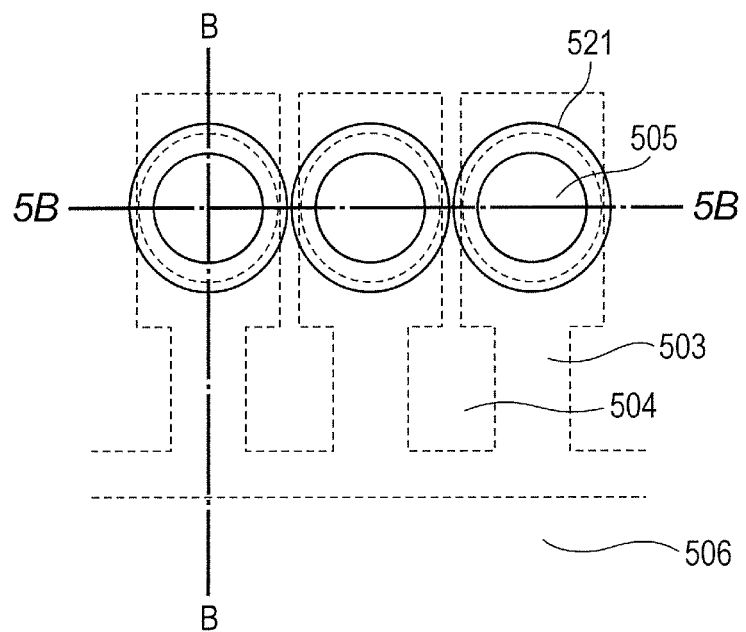
FIGS. 5A and 5B are schematic views illustrating the form of an ejection orifice in a conventional liquid ejection head.
Figure 5B:
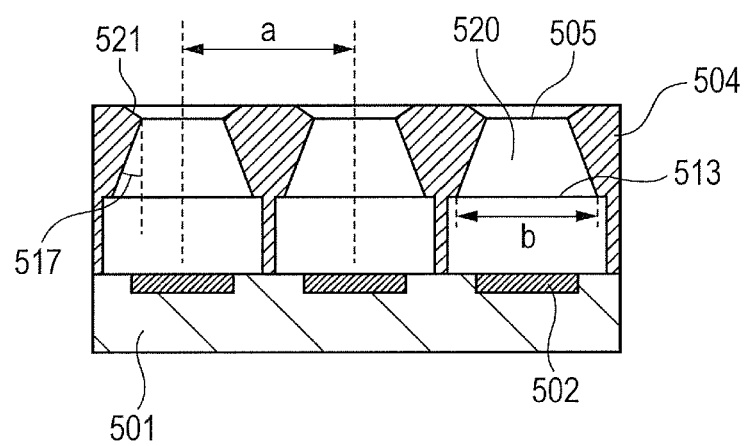

FIGS. 5A and 5B are schematic sectional views illustrating a configuration in which ejection orifices each formed of an upper ejection orifice 521 and a lower ejection orifice 520 are arranged in high density. As illustrated in FIGS. 5A and 5B, in the case where the ejection orifices are arranged in high density, if the lower ejection orifice 520 has an angle 517, a wall between adjacent ink flow paths (hereinafter also referred to as "flow path wall") may become thinner to reduce adhesiveness between a flow path forming member and a substrate 501.

Accordingly, the ejection orifice is desired to have a shape in which a cross section of the ejection orifice taken along a plane which is parallel to an arrangement direction of the ejection orifice (5B-5B direction of FIG. 5A) and is perpendicular to a substrate surface has no taper angle, and a cross section of the ejection orifice taken along a plane perpendicular to the arrangement direction of the ejection orifice has a taper angle.

Therefore, it is an object of the present invention to provide a method of manufacturing a liquid ejection head having a small flow resistance from a ejection energy generating element to an opening of an ejection orifice and an excellent adhesiveness between a flow path forming member and a substrate.

In the following, embodiments of the present invention are described. Note that, numerical values shown in the following embodiments are an example, and the present invention is not limited thereto. Further, the present invention is not limited to each of the embodiments, and the embodiments may be combined. The present invention can be applied also to other technologies to be encompassed in the concept of the present invention described in the scope of claims herein.

Further, an inkjet recording head is herein described as an application example of the present invention, but the application range of the present invention is not limited thereto, and the present invention is applicable also to a recording head for production of biochips, printing of electronic circuits, or the like. Examples of the recording head include, in addition to the inkjet recording head, a head for manufacturing a color filter.

Figure 1A:
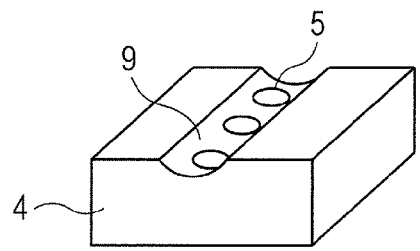
FIGS. 1A, 1B, 1C, and 1D are schematic views illustrating a configuration example of a liquid ejection head obtained by a manufacturing method according to an embodiment of the present invention.
Figure 1B:
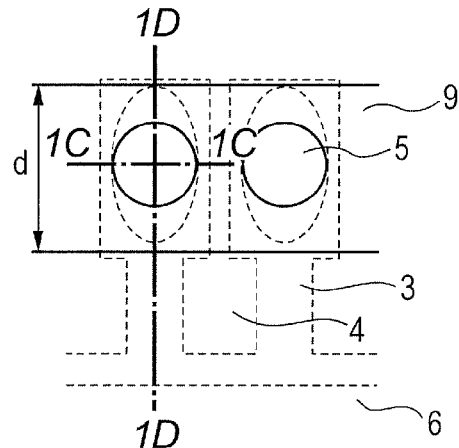
Figure 1C:
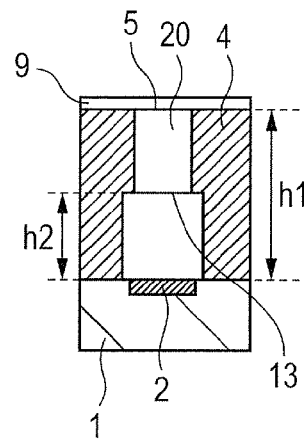
Figure 1D:
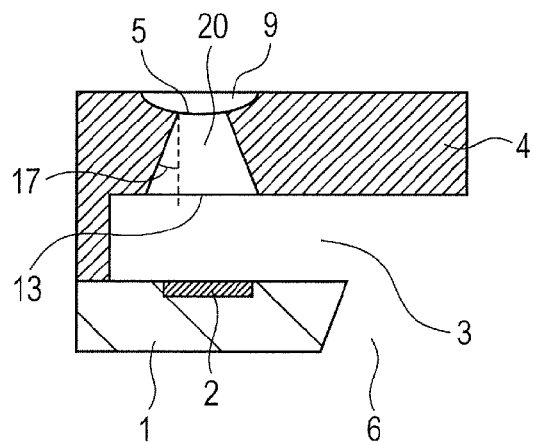
Figure 8:
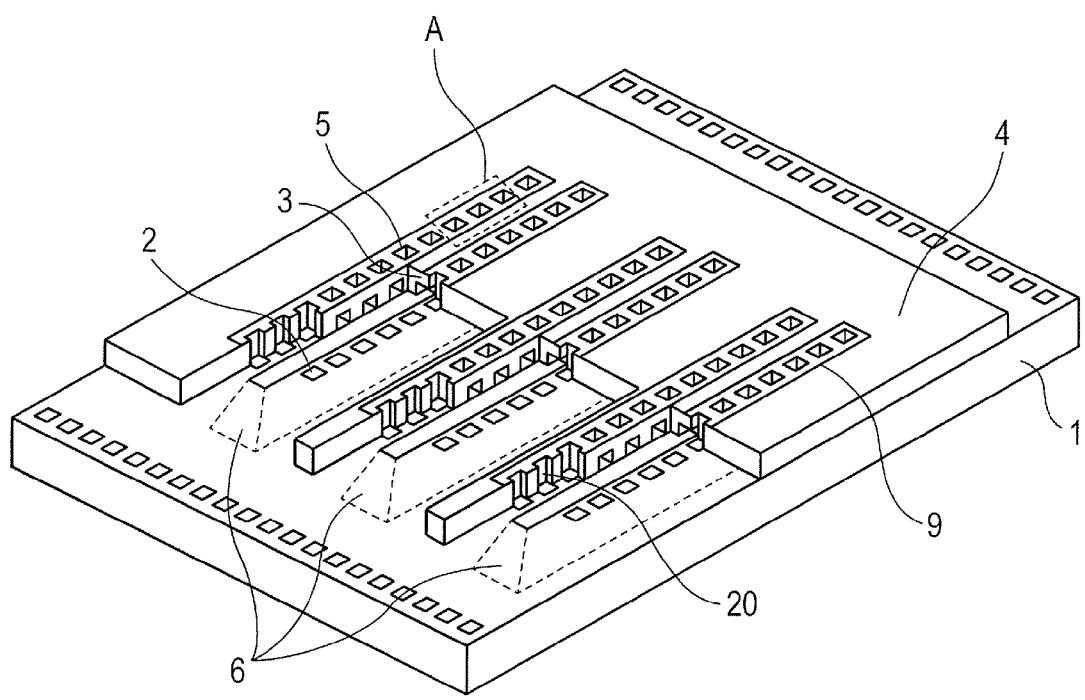
FIG. 8 is a schematic perspective view illustrating a configuration example of the liquid ejection head obtained in the embodiment of the present invention.

FIG. 8 is a schematic perspective view illustrating a configuration example of a liquid ejection head according to an embodiment of the present invention. FIG. 1A is a schematic partial enlarged view illustrating a structure surrounded by the dashed line A of FIG. 8. FIG. 1B is a schematic partial enlarged view illustrating a structure in the vicinity of an ejection orifice as seen from an upper surface side. FIG. 1C illustrates a schematic sectional view of the liquid ejection head in a cross section taken along the line 1C-1C of FIG. 1B. Further, FIG. 1D illustrates a schematic sectional view of the liquid ejection head in a cross section taken along the line 1D-1D of FIG. 1B.

The liquid ejection head according to the embodiment of the present invention includes a substrate 1 on which electrothermal converting elements 2 (hereinafter also referred to as "heaters") as ejection energy generating elements for generating energy used for ejecting ink are formed at a predetermined pitch. The heaters 2 are arranged in at least one row on a front surface (also referred to as "first surface") side of the substrate. In the substrate 1, an ink supply port 6 for supplying ink is formed so as to pass therethrough from a rear surface (also referred to as "second surface") of the substrate 1 to the front surface. Further, an opening of the ink supply port 6 at the substrate front surface side is disposed between two rows of the heaters 2. A flow path forming member 4 is provided on or above the surface (front surface) of the substrate 1 on which the heaters 2 are formed. The flow path forming member 4 constitutes ejection orifices 20 arranged above the respective heaters, and an ink flow path 3 communicating from the ink supply ports 6 to the ejection orifices 20. The liquid ejection head ejects ink droplets from the ejection orifice 20 by applying pressure generated by the heater 2 to ink supplied from the ink supply port 6 via the ink flow path 3. In the figures, reference symbol represents an outer opening (upper opening in the figures) of the ejection orifice 20, and reference symbol represents an inner opening (lower opening in the figures) of the ejection orifice 20.

In the figures, a hollow 9 is provided in the front surface (upper surface in the figures) of the flow path forming member 4 along the row direction of the heaters 2. In a sectional shape of the hollow 9 taken along a plane perpendicular to the row direction of the heaters 2 (hereinafter also referred to as "heater row direction") (corresponding to FIG. 1D), the surface shape of the hollow 9 is a catenary shape, and a deepest portion of the hollow 9 is positioned at the center of the hollow. Further, the deepest portion of the hollow has a constant depth in a formation region of the row of the ejection orifices 20.

In the hollow 9, the outer opening 5 of the ejection orifice 20 is disposed. The center of the ejection orifice is positioned at the deepest portion of the hollow 9. In the ejection orifice 20, as illustrated in FIG. 1B, the outer opening 5 has a circular shape, and the inner opening 13 has an elliptical shape. In a cross section of the ejection orifice 20 taken along a plane parallel to the substrate surface, the cross-sectional area decreases from the inner opening 13 (in particular, the lowest point of the opening) toward the outer opening 5. Further, the centers of all cross sections of the ejection orifice 20 taken along planes parallel to the substrate surface are coaxially positioned. Further, as illustrated in FIG. 1C, in a cross section of the ejection orifice taken along a plane which includes the center line along the row direction of the ejection orifice (line corresponding to the line 1C-1C of FIG. 1B) and is perpendicular to the substrate surface (cross section corresponding to FIG. 1C), an angle between a side surface portion of the ejection orifice 20 and the normal to the outer opening 5 of the ejection orifice is almost 0°. On the other hand, in a cross section of the ejection orifice taken along a plane which passes through the center of the ejection orifice and is perpendicular to the row direction of the ejection orifice (heater row direction) (cross section corresponding to FIG. 1D), a predetermined angle 17 is provided between the side surface portion of the ejection orifice 20 and the normal to the outer opening 5 of the ejection orifice.

In the liquid ejection head obtained in this embodiment, the ejection orifice 20 is disposed above the heater 2, and has a tapered shape in which the cross-sectional area gradually decreases from the inner opening 13 toward the outer opening 5 in the cross section of the ejection orifice 20 taken along the line 1D-1D. It is preferred that the angle 17 between the side surface portion of the ejection orifice 20 and the normal to the outer opening 5 in the cross section of the ejection orifice taken along the plane perpendicular to the substrate surface be 5° or more and 20° or less in the cross section of the ejection orifice 20 taken along the line 1D-1D (in other words, the cross section taken along the plane which passes through the center of the ejection orifice and is perpendicular to the heater row direction). Further, the angle 17 in the cross section of the ejection orifice 20 taken along the line 1D-1D may be larger than 20°. It is also possible to provide the angle 17 different for each ejection orifice depending on desired ejection characteristics.

Now, the embodiment of the present invention is described.

FIGS. 2A to 2G are sectional views illustrating steps in a method of manufacturing a liquid ejection head of this embodiment in the cross section taken along the line 1D-1D of FIG. 1B.

Figure 2A:
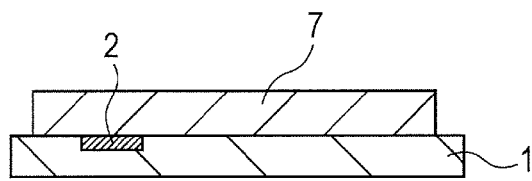
FIGS. 2A, 2B, 2C, 2D, 2E, 2F, and 2G are sectional views illustrating steps in the manufacturing method according to the embodiment of the present invention.

First, as illustrated in FIG. 2A, a flow path mold member 7 as a mold for the ink flow path 3 is formed on the substrate 1 on which the heaters 2 for generating energy for ejecting ink are arranged in row at the front surface side (first surface side) at a predetermined pitch.

Figure 2B:
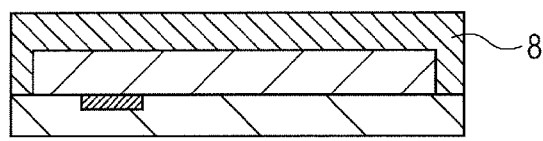

Next, as illustrated in FIG. 2B, a negative resist is disposed on the substrate 1 and the flow path mold member 7 to form a negative photosensitive resin layer 8.

It is desired to select the negative photosensitive resin layer 8 from the viewpoints of characteristics as a cured state such as mechanical strength, ink resistance, adhesiveness with a base layer, resolution as a photolithography material, and the like. As a negative resist satisfying these characteristics, a negative resist having cationic polymerizability is preferred, and a cationic polymerizable epoxy resin composition may be suitably used. There is particularly suitably used a photo-cationic polymerizable epoxy resin composition or oxetane resin composition based on an bisphenol A type epoxy resin, a phenol novolac type epoxy resin, a cresol novolac type epoxy resin, an epoxy resin such as a polyfunctional epoxy resin having a oxycyclohexane skeleton, or an oxetane resin, or a composition obtained by mixing such compositions. It should be noted that by using the epoxy resin having three or more epoxy groups, the cured product thereof can be three-dimensionally crosslinked, which is suitable for obtaining desired characteristics. As a commercially available epoxy resin to be used as the epoxy resin, there are given, for example: "CELLOXIDE 2021", "GT-300 series", "GT-400 series", and "EHPE3150" (trade names) manufactured by Daicel Corporation; "157S70" (trade name) manufactured by Mitsubishi Chemical Corporation; "Epiclon N-865" (trade name) manufactured by DIC Corporation; and "EPIKOTE631" (trade name) manufactured by Mitsubishi Chemical Corporation. As a photoinitiator to be added to the epoxy resin composition, there are preferred, for example, a sulfonic acid compound, a diazomethane compound, a sulfonium salt compound, an iodonium salt compound, and a disulfone-based compound. As a commercially available photoinitiator to be used as the photoinitiator, there are given, for example: "Adeka Optomer SP-170", "Adeka Optomer SP-172", and "SP-150" (trade names) manufactured by ADEKA CORPORATION; "BBI-103" and "BBI-102" (trade names) manufactured by Midori Kagaku Co., Ltd.; and "IBPF", "IBCF", "TS-01", and "TS-91" (trade names) manufactured by SANWA CHEMICAL CO., LTD. Further, for the purpose of improving photolithography performance, adhesive property, and the like, the above-mentioned epoxy resin composition can contain a basic substance such as amines, a photosensitizer substance such as an anthracene derivative, a silane coupling agent, or the like.

Further, as the negative resist, for example, a commercially-available negative resist, such as "SU-8 series" and "KMPR-1000" (trade names) produced by NIPPON KAYAKU Co., Ltd. and "TMMR 52000" and "TMMF 52000" (trade names) produced by TOKYO OHKA KOGYO CO., LTD. can also be used.

It is desired to select the flow path mold member 7 from the viewpoints that the flow path mold member 7 is not dissolved in the negative resist used for the negative photosensitive resin layer 8, that a fine pattern can be formed, and that the flow path mold member 7 can be removed after nozzles are formed. As the flow path mold member 7, a positive resist is preferably used, and specifically, there is suitably used, for example, a vinyl ketone-based resist such as polymethyl isopropenyl ketone or polyvinyl ketone, or an acrylic photodegradable polymer compound. Examples of the acrylic photodegradable polymer compound include a copolymer of methacrylic acid and methyl methacrylate and a copolymer of methacrylic acid, methyl methacrylate, and methacrylic anhydride.

Figure 2C:
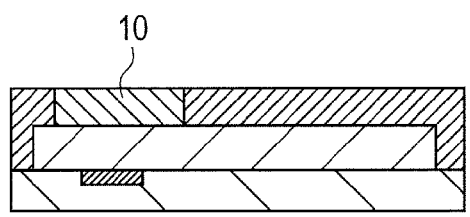

Next, as illustrated in FIG. 2C, first exposure treatment is performed by a photolithography method via a mask (not shown), to thereby form a groove pattern 10 formed of an unexposed portion. The groove pattern 10 is formed along the heater row direction at a position corresponding to the row of multiple heaters 2.

The width of the groove pattern 10 in the lateral direction is, for example, 13 to 100 μm.

Figure 2D:
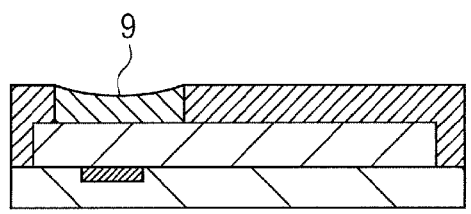

Next, as illustrated in FIG. 2D, heat treatment (post exposure bake; hereinafter referred to as "PEB") is performed at a temperature equal to or higher than a softening point of the negative resist used for the negative photosensitive resin layer 8, to thereby form the hollow 9 in the groove pattern 10. In other words, by performing the heat treatment at the temperature equal to or higher than the softening point of the negative resist, the surface of the groove pattern 10 is recessed, to thereby form the hollow 9.

Note that, the shape and arrangement of the hollow 9 can be appropriately selected depending on required characteristics of the head. Specifically, the shape and arrangement of the hollow can be controlled by adjusting the shape and arrangement of the groove pattern 10, and the shape and arrangement of the groove pattern 10 can be adjusted by a mask. Further, the depth of the hollow 9 can be adjusted by the exposure amount in the first exposure, the temperature and time in the heat treatment, the thickness of the flow path forming member, and the like.

In this embodiment, the deepest portion of the hollow is formed to have a constant depth in the formation region of the row of the ejection orifices.

The heat treatment temperature is, for example, 60 to 150° C.

The sectional shape of the hollow taken along the plane perpendicular to the row direction of the ejection orifice is, for example, a catenary shape.

Figure 2E:
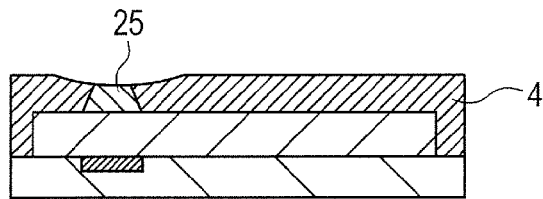

Next, as illustrated in FIG. 2E, second exposure treatment is performed via a mask (not shown), to thereby form a latent image 25 of the ejection orifice 20.

In this embodiment, a front surface portion (surface exposed to the hollow surface) of the latent image 25 is disposed in the hollow 9. Further, the latent image is formed so that the center of the front surface portion thereof is positioned at the deepest portion of the hollow 9.

Figure 2F:
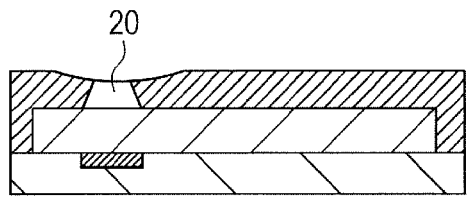

Next, as illustrated in FIG. 2F, development treatment is performed, to thereby form the ejection orifice 20.

The obtained ejection orifice 20 has a shape as illustrated in FIGS. 1C and 1D in which an angle between the side surface portion and the normal to the outer opening in the cross section taken along the line 1D-1D is larger than an angle between the side surface portion and the normal to the outer opening in the cross section taken along the line 1C-1C. In particularly, in this embodiment, the ejection orifice 20 is formed so that the angle between the side surface portion and the normal to the outer opening in the cross section taken along the line 1C-1C is 0°. Further, the angle between the side surface portion and the normal to the outer opening in the cross section taken along the line 1D-1D is larger than an angle between the side surface portion and the normal to the outer opening in each of all cross sections of the ejection orifice taken along planes which are perpendicular to the substrate surface and along the row direction of the ejection orifice. Further, in this embodiment, in a plan view on the plane parallel to the substrate surface, the outer opening of the ejection orifice has a circular shape, and the inner opening has an elliptical shape.

Examples of an exposure machine that can be used for the above-mentioned first and second exposure include an projection exposure machine having a single-wavelength light source, such as an I-line exposure stepper (manufactured by Canon Inc.) or a KrF stepper (manufactured by Canon Inc.), or a broad-wavelength light source of a mercury lamp, such as a mask aligner MPA-600 Super (trade name, manufactured by Canon Inc.). Further, an example of the mask that can be used includes a mask in which a light blocking film such as a chromium film is formed on a base made of a material for allowing light of an exposure wavelength to transmit therethrough, such as glass or quarts, in accordance with a pattern for not curing the negative photosensitive resin layer 8 such as the ejection orifice.

Figure 2G:
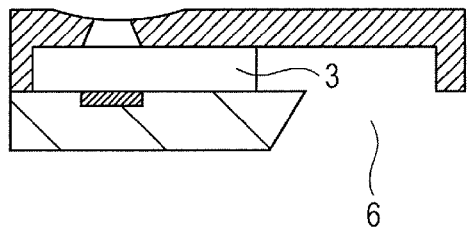

Next, as illustrated in FIG. 2G, an ink supply port 6 is formed by anisotropic etching. After that, the flow path mold member 7 is removed from the ink supply port 6, to thereby form the ink flow path 3.

More specifically, a mask (not shown) for forming the ink supply port (liquid supply port) 6 is disposed on the rear surface (second surface) of the substrate 1, and the flow path forming member 4 side of the substrate 1 is protected by a protective film (not shown) such as a rubber film. After that, anisotropic etching for Si substrate is performed to etch the substrate from the rear surface to the front surface, to thereby form the ink supply port 6. After the ink supply port 6 is formed, the protective film is removed, and the flow path mold member 7 is dissolved and removed by a solvent.

After that, in order to completely cure the flow path forming member 4, a heating process is performed at 200° C. for 1 hour, and then electrical connections and ink supply means are appropriately arranged, to thereby complete a liquid ejection head (not shown).

Note that, a water repellent layer may be formed on the surface of the flow path forming member 4. The water repellent layer is required to have ink repellency and high mechanical strength against wiping involving a contact by a wiper or the like. Therefore, as the water repellent layer, a negative resist having repellency such as fluorine or silicon, or a condensate containing a hydrolyzable silane compound having a fluorine-containing group and a hydrolyzable silane compound containing a cationic polymerizable group is suitably used. For example, a water repellent layer is formed after the application of the negative photosensitive resin layer 8 and the heat treatment, and is patterned simultaneously with the exposure of the negative photosensitive resin layer 8. In this way, the water repellent layer can be suitably formed.

Now, a mechanism that the angle 17 is formed between the side surface portion of the ejection orifice and the normal to the outer opening 5 in the cross section of the ejection orifice 20 of FIG. 1D according to the present invention is described with reference to FIGS. 4A to 4C.

Figure 4A:
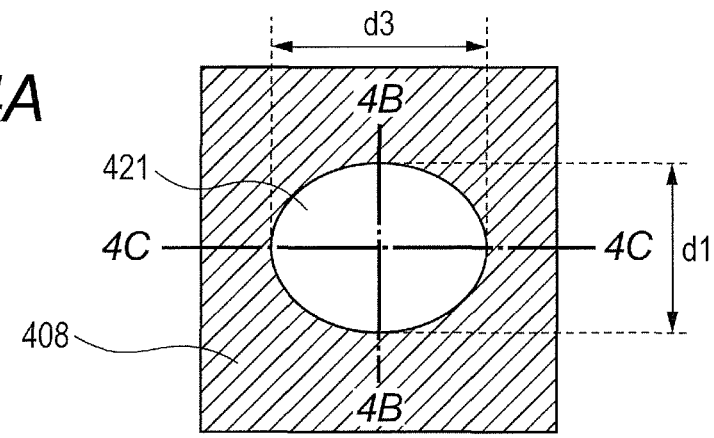
FIGS. 4A, 4B, and 4C are schematic views illustrating a mechanism of forming an ejection orifice shape according to the embodiment of the present invention.

FIG. 4A is a schematic plan view of a negative photosensitive resin layer 408 in which a recess 421 is formed, as seen from above. Note that, the structures other than the negative photosensitive resin layer 8 are omitted. Further, FIG. 4B is a schematic sectional view illustrating a cross section taken along the line 4B-4B passing through the center of the recess 421 illustrated in FIG. 4A. Further, FIG. 4C is a schematic sectional view illustrating a cross section taken along the line 4C-4C passing through the center of the recess 421 illustrated in FIG. 4A. In FIG. 4A, d1 represents the width of the recess 421 in the direction of the line 4B-4B, and d3 represents the width of the recess 421 in the direction of the line 4C-4C. Further, d3 is larger than d1. Further, the surface of the recess 421 has an elliptical shape as illustrated in FIGS. 4A to 4C. Further, in the cross section of the recess taken along the line 4B-4B (see FIG. 4B), the recess is horizontally symmetrical about a center line of the recess perpendicular to the substrate surface (line which passes through the center of the surface of the recess and is perpendicular to the substrate surface). Further, in the cross section of the recess taken along the line 4C-4C (see FIG. 4C), the recess is horizontally symmetrical about the center line of the recess perpendicular to the substrate surface. The recess 421 has the same role as the hollow 9 described in the above-mentioned embodiment, and forms an ejection orifice of this embodiment by utilizing the difference in incident angle of irradiation light between the direction of the line 4B-4B and the direction of the line 4C-4C.

First, referring to FIG. 4B, the effect of the recess 421 is described below.

Figure 4B:
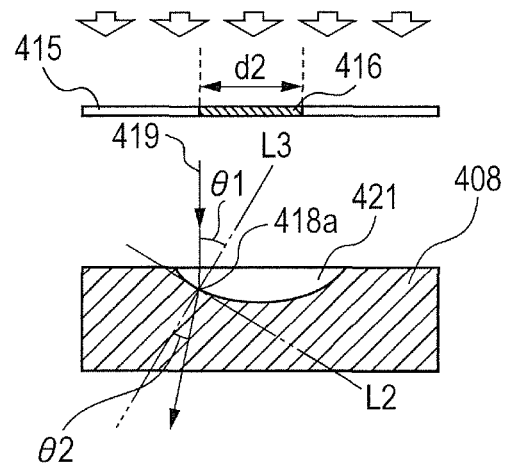

In FIG. 4B, an irradiation end portion 418a represents an end portion of an exposure region on the surface of the negative photosensitive resin layer 408. The irradiation end portion 418a is exposed to light via a mask 415 so as to be positioned within the recess 421. Further, the mask 415 has a light blocking portion 416 corresponding to an ejection orifice pattern having a diameter of d2 (d1>d2).

Light which irradiates the irradiation end portion 418a of the recess 421 via the mask 415 enters the negative photosensitive resin layer. The light which has entered the negative photosensitive resin layer is refracted at the irradiation end portion 418a and travels.

Now, the tangent to the recess 421 at the irradiation end portion 418a is represented by L2, the perpendicular to the tangent L2 is represented by L3, the angle between the perpendicular L3 and irradiation light 419 is represented by $\theta1$, and the angle between the perpendicular L3 and light refracted at the irradiation end portion 418a (refracted light) is represented by $\theta2$. According to the Snell's law, the relational expression of $n1 \sin \theta1 = n2 \sin \theta2$ is established, where n1 is a refractive index in space in the recess 421, and n2 is a refractive index of the negative photosensitive resin layer. When the space in the recess 421 is air, the refractive index n1 is 1. The refractive index n2 of the negative photosensitive resin layer is 1 or more, and hence the refractive angles are $\theta2 < \theta1$. Accordingly, the light blocking portion obtained by light radiated in the recess 421 becomes wider as being closer to the deep portion, and hence the shape of the ejection orifice obtained by development treatment is a tapered shape in which the cross-sectional area gradually decreases from the deep portion of the negative photosensitive resin layer toward the outer opening of the ejection orifice.

Figure 4C:
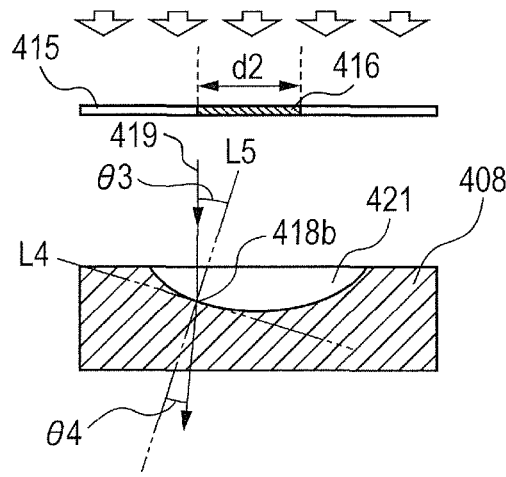

Next, referring to FIG. 4C, the case where the diameter of the recess 421 is large (diameter d3>d1) is described.

When the tangent to the recess 421 at the irradiation end portion 418a in FIG. 4C is represented by L4, the inclination of the tangent L4 becomes closer to the direction perpendicular to the incident line (irradiation light) 419 as compared to the inclination of the tangent L2 in FIG. 4B. Accordingly, in the case of the same material of the negative photosensitive resin layer, the incident angles are $\theta3 < \theta1$, and the refraction angles are $\theta4 < \theta2$. Therefore, the taper angle 17 of the obtained ejection orifice varies depending on the position of an irradiation end portion 418b of the recess 421, that is, the inclination of the tangent to the recess 421. As the inclination of the tangent to the recess 421 becomes closer to the direction perpendicular to the incident light, the angle 17 between the side surface of the ejection orifice and the normal to the outer opening of the ejection orifice becomes a smaller value.

Note that, the formation of the angle 17 at the time of formation of the ejection orifice is affected also by optical conditions of exposure, the material used for the negative photosensitive resin layer 8, and the like.

Further, in forming the ejection orifice in the hollow 9 of the negative photosensitive resin layer 8, if a portion of the hollow 9 at which the tangent is perpendicular to the incident light is used, the taper angle 17 is not provided to the ejection orifice. In other words, $\theta3$ can be set to 0 as in the above-mentioned embodiment. In the above-mentioned embodiment, $\theta3$ becomes 0 at an irradiation end portion positioned at the deepest portion of the hollow 9.

Further, the curing of a flow path wall portion of the flow path forming member is performed with use of light for exposing an ejection orifice pattern, and in the above-mentioned embodiment, the curing is performed in the second exposure in the step illustrated in FIG. 2E. Further, in the case where the dimension of the recess 421 is smaller than an ejection orifice pitch, or the case where the incident angle θ1 in the exposure of the ejection orifice pattern is large, exposure light refracted by the recess 421 intersects with exposure light from an adjacent recess in the negative photosensitive resin layer, with the result that a desired shape of the flow path wall may not be obtained. Accordingly, the ejection orifice pitch, the dimension of the hollow 9, the ejection orifice diameter, the taper angle, and the like need to be appropriately set for manufacturing the head.

In the above-mentioned embodiment, the form in which the ejection orifices are arranged along the ink supply port in one row on each side of the ink supply port has been described. However, it is only necessary that the ejection orifices be formed in row. For example, the ejection orifices can be provided in a plurality of rows on each side of the ink supply port.

Further, in the above-mentioned embodiment, an example of forming the hollow along the row direction has been specifically described. However, the present invention is not limited to this form. As illustrated in FIGS. 4A to 4C, the hollow may be formed for each ejection orifice. In this case, $θ3≈0$ is preferred. Further, the hollow only needs to have a shape which is inclined at both sides in the cross section taken along the plane perpendicular to the row direction of the ejection orifice.

In the shape of the ejection orifice obtained in this embodiment, the angle between the side surface portion of the ejection orifice and the normal to the outer opening in the cross section of the ejection orifice taken along the plane which passes through the center of the ejection orifice and is perpendicular to the row direction (cross section corresponding to FIG. 1D) is larger than the angle between the side surface portion and the normal to the outer opening in the cross section of the ejection orifice taken along the plane which includes the center line (line corresponding to the line 1C-1C of FIG. 1B) of the ejection orifice in the row direction and is perpendicular to the substrate surface (cross section corresponding to FIG. 1C). In other words, when a latent image of the ejection orifice is formed in the hollow 9, an angle between a side surface portion thereof and the normal to the front surface portion in a cross section of the latent image taken along a plane which passes through a center of the latent image and is perpendicular to the row direction is larger than an angle between the side surface portion and the normal to the front surface portion in a cross section of the latent image taken along a plane which includes a center line of the latent image in the row direction and is perpendicular to a substrate surface.

Further, it is preferred that, in the shape of the ejection orifice obtained in this embodiment, the angle between the side surface portion and the normal to the outer opening in the cross section of the ejection orifice taken along the plane which passes through the center of the ejection orifice and is perpendicular to the row direction be larger than the angle between the side surface portion and the normal to the outer opening in each of all cross sections of the ejection orifice taken along planes which are perpendicular to the substrate surface and along the row direction. In other words, it is preferred that the angle between the side surface portion and the normal to the front surface portion in the cross section of the latent image taken along the plane which passes through the center of the latent image and is perpendicular to the row direction be larger than an angle between the side surface portion and the normal to the front surface portion in each of all cross sections of the latent image taken along planes which are perpendicular to the substrate surface and along the row direction.

In the above-mentioned embodiment, in the cross section of the latent image taken along the plane parallel to the substrate surface, the front surface portion has a circular shape, and the rear surface portion (surface of the latent image on the side opposite to the front surface portion) has an elliptical shape. However, the present invention is not particularly limited to this form.

In this embodiment, the latent image of the ejection orifice is formed in the hollow by utilizing the difference in refractive angle caused by the inclination of the hollow. However, the shape of the hollow is not particularly limited as long as an ejection orifice having the above-mentioned shape can be formed. For example, as described in the above-mentioned embodiment, the hollow can be formed along the row direction, and further, the hollow can be formed into a shape in which the cross section in the lateral direction thereof has a catenary shape.

Further, the cross section in the lateral direction is not particularly required to be a catenary shape, and an appropriate shape can be selected as long as the above-mentioned ejection orifice can be formed.

Further, as illustrated in FIGS. 4A to 4C, one hollow may be disposed in each ejection orifice, and the shape thereof can be appropriately selected.

Further, in the above-mentioned embodiment, the groove pattern 10 formed by using the photolithography step is subjected to heat treatment to be concave, thereby forming the hollow 9. However, the hollow 9 may be formed by another method such as an imprint method.

In the following, a method of forming the hollow 9 by using an imprint method is described. In the imprint method, a master for molding (hereinafter referred to as "mold") having a convex pattern corresponding to a hollow to be transferred is pressed against the negative photosensitive resin layer 8. In this manner, a hollow pattern can be transferred to the negative photosensitive resin layer 8. As the conditions of pressing a mold, for example, the mold temperature is 20 to 120° C., and the pressure is 0.01 to 5 MPa. In a general imprint method, a mold is heated to a temperature equal to or higher than a glass transition temperature of a resin to which a pattern is to be transferred, and the pattern is transferred with a pressure of several MPa. However, in the present invention, the aspect ratio of the pattern is small, and it is not necessary to transfer a hollow pattern into a deep portion of the negative photosensitive resin layer 8, and hence patterning can be performed at a relatively low temperature and a low pressure. As a base of the mold, for example, various materials including various kinds of metal materials, glass, ceramic, silicon, quarts, plastics, and a photosensitive resin can be used. In the case where the hollow 9 is formed by using the imprint method, after the groove pattern 10 is provided, a hollow pattern can be formed in the groove pattern 10 by using a mold.

Further, in the above-mentioned embodiment, after the groove pattern is formed, the hollow is formed in the surface of the groove pattern. However, the present invention is not particularly limited to the groove pattern. In other words, heat treatment may be performed after the negative photosensitive resin layer is exposed to light to form the exposure pattern formed of the unexposed portion. In this case, a hollow can be formed in the front surface portion of the exposure pattern. The exposure pattern can be appropriately selected depending on a desired hollow shape.

EXAMPLE 1

In the following, Example 1 of the present invention is described. In this example, a liquid ejection head having a configuration of FIGS. 1A to 1D and 8 was manufactured.

Further, in the liquid ejection head obtained in this example, the height of the ejection orifice is 25 µm, the height of the ink flow path is 14 µm, the diameter of the outer opening of the ejection orifice is 12 µm, and the ejection orifice pitch is 21 µm (1,200 dpi). Further, in the sectional shape of the ejection orifice in a plane which passes through the center of the outer opening of the ejection orifice and is parallel to the direction of the line 1C-1C (row direction of the ejection orifices), the taper angle is 0°. Further, in the sectional shape of the ejection orifice in a plane which passes through the center of the outer opening of the ejection orifice and is perpendicular to the direction of the line 1C-1C, the taper angle is 15°.

Note that, as illustrated in FIG. 1C, the height of the ejection orifice corresponds to a distance h1 from the substrate 1 to the front surface opening (outer opening) of an ejection orifice 5, and the height of the ink flow path corresponds to a thickness h2 of the ink flow path 3. The pitch corresponds to a distance between the adjacent heaters 2 (center-to-center distance). Further, the opening diameter of the ejection orifice corresponds to a diameter of the front surface opening (outer opening) of the ejection orifice in the top view of the ejection orifice illustrated in FIG. 1B. In this example, the outer opening of the ejection orifice has a circular shape in the top view. Note that, the inner opening (also referred to as "rear surface opening") of the ejection orifice has an elliptical shape.

In this example, the liquid ejection head was produced in accordance with the above-mentioned embodiment, in other words, steps illustrated in FIGS. 2A to 2G.

First, as illustrated in FIG. 2A, on the substrate 1 having the heater 2 provided on the front surface side (first surface side) thereof, polymethylisopropenylketone (produced by TOKYO OHKA KOGYO CO., LTD., trade name; ODUR-1010) as a material for the flow path mold member 7 was applied at a thickness of 14 µm, and heat treatment was performed at 120° C. for 6 minutes. Then, exposure and development were performed, to thereby form the flow path mold member 7 as a mold pattern for the ink flow path 3.

In the above-mentioned embodiment, when the width of the flow path wall becomes 4 µm or less, due to the heat and the like generated during driving of the liquid ejection head, peeling may occur between the flow path wall and the substrate. Therefore, in this example, in order to form the flow path wall with a width of 6 µm, the flow path mold member 7 was formed so that, in the cross section taken along the plane which passed through the opening center of the ejection orifice, was parallel to the row direction of the ejection orifices, and was perpendicular to the substrate surface, the width of the flow path wall (hereinafter referred to as "ink flow path width") was 15 µm.

Next, as illustrated in FIG. 2B, in order to form the flow path forming member 4, an SU-8 resist (produced by NIPPON KAYAKU Co., Ltd., trade name; SU-8 3025) as a cationic polymerizable photopolymerizable resin composition was applied on the substrate 1 and the flow path mold member 7 so that its thickness from the surface of the substrate 1 was 25 µm. Then, heat treatment was performed at 95° C. for 10 minutes.

Next, as illustrated in FIG. 2C, an I-line exposure stepper (manufactured by Canon Inc.) was used to expose the exposure portion with light at 2,500 J/m², to thereby form the groove pattern 10 as the unexposed portion (FIG. 2C). The groove pattern was formed to have a width of 20 µm in a direction parallel to the substrate surface in the cross section taken along the plane perpendicular to the row direction of the ejection orifices. Note that, the dimension of the light blocking portion on the mask, which corresponded to the groove pattern, the dimension corresponding to d in the direction of the line 1D-1D of FIG. 1B, was 20 µm. Further, the light blocking portion was formed so that its longitudinal shape included the length of the row of the ejection orifices and further outwardly extended by 11 µm from each of end portions of the ejection orifices on both outermost sides.

Next, as illustrated in FIG. 2D, PEB treatment was performed at 100° C. for 4 minutes, to thereby form the hollow 9 on the surface of the groove pattern 10.

In this case, the center of the ejection orifice is positioned on the center line of the groove pattern in the longitudinal direction (row direction of the ejection orifices). Further, all of the openings of the ejection orifices arranged in a row are formed in the groove pattern. Further, the depth of the hollow 9 (distance from the surface of the flow path forming member to the deepest portion (lowest point) of the hollow 9) was about 4 µm.

Next, as illustrated in FIG. 2E, an I-line exposure stepper was used to perform exposure at 3,500 J/m², to thereby form the latent image 25 of the ejection orifice. At this time, the latent image 25 was formed so that the center of the front surface portion (surface exposed to the hollow surface) of the latent image 25 was positioned at the deepest portion of the hollow 9. Further, the diameter of the light blocking portion on the mask, which corresponded to the ejection orifice, was 12 µm.

Next, as illustrated in FIG. 2F, PEB treatment was performed at 90° C. for 4 minutes, and then development was performed with use of propylene glycol monomethylether acetate. Thus, the ejection orifice 20 was formed.

Next, as illustrated in FIG. 2G, the ink supply port 6 was formed by crystal anisotropic etching. Then, the entire surface was irradiated with ultraviolet light to break down the flow path mold member 7 forming the mold pattern for the ink flow path. Then, methyl lactate was used to dissolve and remove the flow path mold member 7. Thus, the liquid ejection head was produced.

The obtained liquid ejection head was cut at the part of the ejection orifice 20 and its sectional shape was measured. The cross section of the ejection orifice taken along the line 1C-1C did not have a tapered shape but a rectangular shape. In other words, the angle 17 was 0°. Further, the cross section of the ejection orifice taken along the line 1D-1D had a tapered shape, and the angle 17 was 15°.

Figure 6:
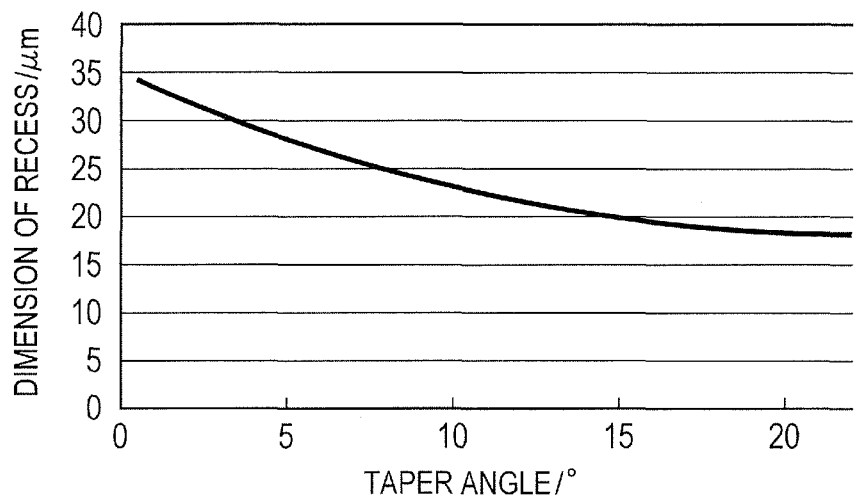
FIG. 6 is a graph showing a relation between a dimension of a recess and an angle 17 in a case of forming an ejection orifice having an opening diameter of 12 µm according to the embodiment of the present invention.

FIG. 6 is a graph showing the correlation between the angle 17 between the side surface portion of the ejection orifice and the normal to the outer opening, and the lateral width of the hollow 9 (see FIG. 1B) in the cross section taken along the line 1D-1D in the manufacturing method of this example when the ejection orifice diameter is 12 µm. As shown in FIG. 6, when the width d of the hollow 9 is 34 µm, the angle 17 is 1°, and, when the width d of the hollow 9 is 20 µm, the angle 17 is 15°.

Figure 7A:
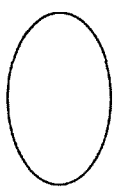
FIGS. 7A, 7B, 7C, and 7D are schematic views illustrating configuration examples of the ejection orifice in the liquid ejection head obtained in the embodiment of the present invention.
Figure 7B:
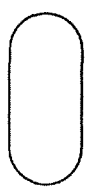
Figure 7C:
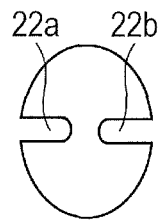
Figure 7D:
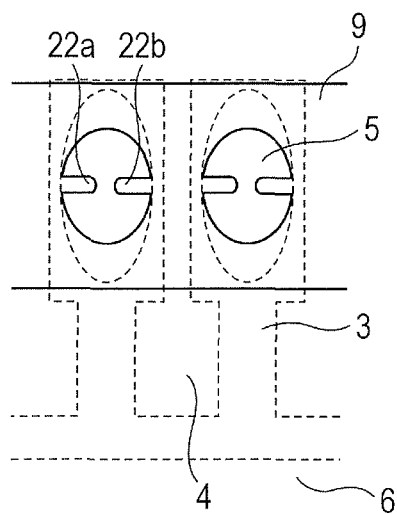

Further, in this example, the ejection orifice was formed with use of a mask having a circular light blocking portion corresponding to the ejection orifice so that the ejection orifice had a circular shape when viewed from above the substrate. However, considering the ejection characteristics and the like, appropriate shapes may be selected as those illustrated in FIGS. 7A to 7C. In particular, when the ejection orifice 20 including opposing protrusions 22a and 22b therein as illustrated in FIG. 7C is used, liquid can be held between the protrusions 22a and 22b. Therefore, it is possible to significantly reduce the risk that the ink droplet is divided into a plurality of parts (main droplet and satellite) when the ink droplet is ejected. Thus, printing in higher image quality can be realized. In particular, the ejection orifice including the protrusions 22a and 22b has a greater ability to hold the liquid between the protrusions 22a and 22b as the angle 17 becomes smaller in the cross section taken along the line 1C-1C, and thus the effect of reducing generation of the satellite is increased. The protrusions 22a and 22b may be formed in the row direction of the ejection orifices, or may be formed in a direction perpendicular to the ejection orifice row. However, as illustrated in FIG. 7D, when the protrusions 22a and 22b are provided so that the protrusions 22a and 22b match with the row direction of the ejection orifices, the angle 17 of the ejection orifice part at the leading end portion of the protrusion becomes substantially 0°, and hence a greater effect can be obtained.

EXAMPLE 2

In the following, Example 2 of the present invention is described. In this example, a substrate having a pitch between the adjacent heaters 2 corresponding to 600 dpi was used. Further, the height of the ink flow path 3 was 19 μm, the height of the ejection orifice 20 was 55 μm, the ink flow path width was 36 μm, and the diameter of the outer opening 5 of the ejection orifice was 30 μm.

FIGS. 3A to 3J are sectional views illustrating steps in the manufacturing method of this example in a cross section taken along the line 1D-1D of FIG. 1B.

Figure 3A:
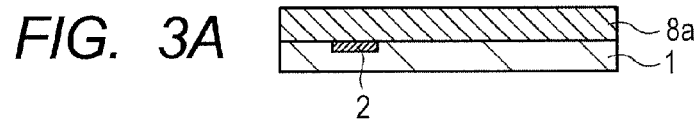
FIGS. 3A, 3B, 3C, 3D, 3E, 3F, 3G, 3H, 3I, and 3J are sectional views illustrating steps in a manufacturing method according to Example 2 of the present invention.

First, as illustrated in FIG. 3A, on the substrate 1 having the heater 2 for generating energy for ejecting ink arranged thereon, a first negative photosensitive resin layer 8a shown in Table 1 was formed to form a wall member 11 forming a wall part of the flow path forming member.

Table 1 shows the first negative photosensitive resin layer 8a used in this example.

TABLE 1

| Epoxy resin | EHPE-3150, Daicel Corporation. | 100 parts |
|---|---|---|
| Add-in material | 1,4-HFAB, Central Glass Co., Ltd. | 20 parts |
| Cationic polymerizable initiator | SP-172, ADEKA CORPORATION | 6 parts |
| Silane coupling agent | A-187, Momentive Performane Materials Japan. | 5 parts |
| Solvent | Xylene, KISHIDA CHEMICAL Co., Ltd. | 70 parts |

Figure 3B:
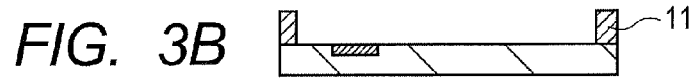

Next, as illustrated in FIG. 3B, an I-line exposure stepper (manufactured by Canon Inc.) was used to expose a part of the first negative photosensitive resin layer 8a other than a region for the flow path pattern with light at 3,500 J/m$^2$. Then, PEB treatment was performed at 90° C. for 5 minutes. After that, development was performed with a mixture solvent of xylene and methyl isobutyl ketone. Thus, the wall member 11 was formed.

Figure 3C:
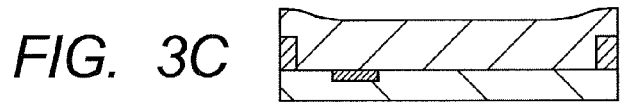

Next, as illustrated in FIG. 3C, a dissolvable resin layer was formed on the wall member 11 by a spin coating method. The thickness of the dissolvable resin layer was sufficiently larger than the height of the wall member 11.

The dissolvable resin layer may be arranged by other methods such as a direct coating method and a laminate transfer method, but the present invention is not limited thereto.

Further, in this example, a cresol novolac resin was used as the dissolvable resin layer.

Figure 3D:
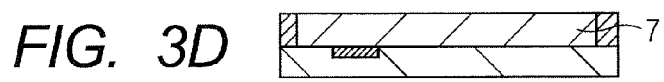

Next, as illustrated in FIG. 3D, the dissolvable resin layer was subjected to polishing until the upper surface of the wall member 11. Thus, the flow path mold member 7 was formed, which was buried in a region surrounded by the wall member 11.

As the polishing method, it is possible to use a chemical mechanical polishing (CMP) technology which is a chemical mechanical polishing method using a slurry. In this case, the wall member 11 previously formed of a negative photosensitive resin is sufficiently cured by exposure, and hence there is a difference in hardness between the dissolvable resin and the wall member 11. Therefore, the wall member 11 plays a role as a stop layer for polishing. Therefore, the dissolvable resin can be stably polished and removed until the upper portion of the wall member 11, and the flow path mold member 7 having a constant thickness can be obtained with good reproducibility. For example, alumina, silica, and the like can be used as the polishing grain to be used during polishing.

Figure 3E:
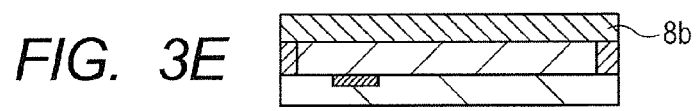

Next, as illustrated in FIG. 3E, on the wall member 11 and the flow path mold member 7, a dry film resist (hereinafter referred to as "DF") was arranged by laminate processing, to thereby form a second negative photosensitive resin layer 8b. After the laminate processing, heat treatment was performed at 90° C. for 5 minutes.

Figure 3F:
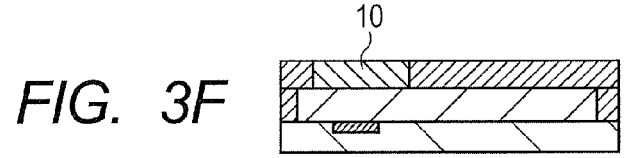
Figure 3G:
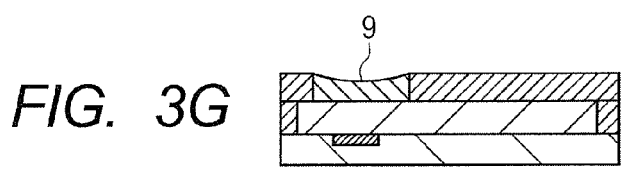

Next, as illustrated in FIG. 3F, by a photolithography technology, the groove pattern 10 was formed with use of a mask (not shown). Specifically, the I-line exposure stepper (manufactured by Canon Inc.) was used to perform exposure under conditions of 2,500 J/m$^2$ and a focus shift by 50 μm from the resin surface to the substrate surface side, to thereby form the groove pattern 10. Then, as illustrated in FIG. 3G, heat treatment was performed at 100° C. for 5 minutes, to thereby form the hollow 9 on the surface of the groove pattern 10.

The groove pattern was formed along the heater row at a position corresponding to the row of the heaters 2. Further, in the cross section taken along the line 1D-1D of FIG. 1B, the width of the groove pattern (corresponding to d) was 40 μm. Further, the groove pattern was formed so as to include the length of the ejection orifice row in the direction of the line 1C-1C (row direction) and further outwardly extend by 10 μm from each of end portions of the ejection orifices on both outermost sides. The depth of the hollow 9 was about 4 μm.

Figure 3H:
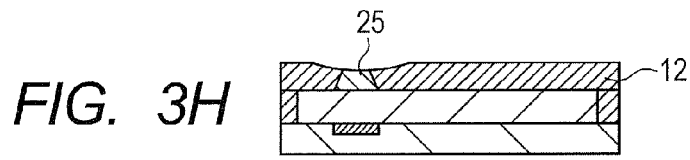

Next, as illustrated in FIG. 3H, via the mask (not shown), exposure was performed at 3,500 J/m$^2$ with use of an I-line exposure stepper, to thereby form the latent image 25 of the ejection orifice. Further, FIG. 3H illustrates an ejection orifice plate 12 forming an upper wall of the flow path forming member.

The latent image 25 was disposed so that its front surface portion was included in the hollow 9 provided on the surface of the groove pattern 10. Further, the latent image 25 was formed so that the center of the front surface portion of the latent image 25 of each ejection orifice matched with the center of the groove pattern in the lateral direction (direction of the line 1D-1D). The latent image 25 was formed so that the diameter of the outer opening of the ejection orifice was 30 μm.

Figure 3I:
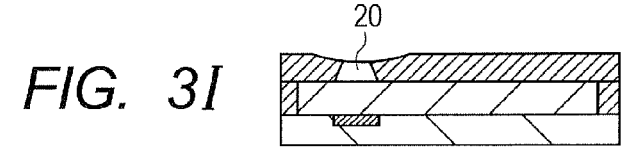

Next, as illustrated in FIG. 3I, after PEB treatment was performed at 90° C. for 4 minutes, development was performed with a mixture solvent of xylene and methyl isobutyl ketone, to thereby form the ejection orifice 20.

Figure 3J:
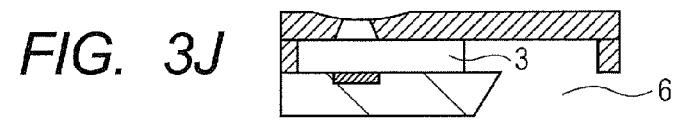

Next, as illustrated in FIG. 3J, the ink supply port 6 was formed by crystal anisotropic etching, and then the flow path mold member 7 was dissolved and removed by a solvent. Thus, the liquid ejection head was produced.

The obtained liquid ejection head was cut at the part of the ejection orifice 20 and its sectional shape was measured. In the cross section of the ejection orifice 20 taken along the line 1C-1C, the angle 17 was 0°. Further, in the cross section of the ejection orifice 20 taken along the line 1D-1D, the angle 17 was 10° and a tapered shape was formed.

Note that, in this example, a distance between the ejection orifice positioned at the end portion of the ejection orifice row on the outermost side and the longitudinal end portion of the hollow was 10 µm. The depth of the hollow is changed by changing the type of the material to be used for the flow path mold member, the hollow shape, the PEB condition, and the like. The hollow in the row direction is constant, and it is necessary to change the necessary ejection orifice diameter for not tapering the cross section of the ejection orifice. Therefore, the distance between the end portion of the outermost ejection orifice of the ejection orifice row used for ejection and the longitudinal end portion of the hollow is set as appropriate. Further, an ejection orifice not used for image formation may be formed on the further outer side of the ejection orifice used for ejection.

Further, in this example, in the cross section of the hollow and the ejection orifice taken along a plane which passed through the center of the outer opening of the ejection orifice and was perpendicular to the row direction of the ejection orifices, a distance in a direction parallel to the substrate surface, between the end portion of the hollow (part in which the hollow and the surface of the flow path forming member are brought into contact with each other) and the end portion of the ejection orifice was 5 µm. By reducing this distance, a tapered shape having a larger angle can be formed in the cross section of the ejection orifice. As the end portion shape of the outer opening part in the cross section of the ejection orifice has a smaller roundness and is closer to an angle, separation of the ejected liquid droplet is improved, and hence the ejection characteristics are improved. In order to obtain particularly satisfactory ejection characteristics, the distance is desired to be 4 µm or more.

Note that, in this example, a laminate method of DF was used for forming the second negative photosensitive resin layer 8b as the material for the ejection orifice plate 12, but other methods such as a spin coating method and a direct coating method may be used instead.

COMPARATIVE EXAMPLE 1

For comparison, there was produced an ink jet recording head including the ejection orifice having the same angle 17 both in the cross section of the ejection orifice taken along the line 1C-1C and in the cross section of the ejection orifice taken along the line 1D-1D.

In the following, this comparative example is described with reference to FIGS. 5A and 5B. FIG. 5A is a schematic top view of the ink jet recording head produced in this comparative example. FIG. 5B is a schematic sectional view taken along the line 5B-5B of FIG. 5A. In FIG. 5B, "a" represents a distance between the centers of adjacent heaters 502 (hereinafter referred to as "ejection orifice pitch") provided on a substrate 501, and "b" represents a diameter of the opening (inner opening, or also referred to as "rear surface opening") 513 on an ink flow path 503 side of an ejection orifice 520.

In the ink jet recording head used in this comparative example, the height of the ejection orifice is 25 µm, the height of the ink flow path is 14 µm, and the ejection orifice pitch is 21 µm (1,200 dpi). In order to form a recess 521 divided for each ejection orifice, the dimension of the recess 521 was set to φ20 µm. Further, the outer opening 505 of the ejection orifice 520 was formed to φ12 µm.

Referring to FIG. 6, when the ejection orifice 520 of φ12 µm is formed in the recess 521 of φ20 µm, in the cross section of the ejection orifice 520 taken along the line B-B, the angle 517 becomes 15°. Therefore, when the opening diameter b of the ejection orifice 520 on the ink flow path side is calculated, the opening diameter b becomes φ18 µm. Further, in this comparative example, considering, for example, the alignment with respect to the flow path mold member 7 when the ejection orifice 520 is exposed with light, design is made so that the dimension of the ink flow path width is larger than the opening diameter b of the ejection orifice 520 on the ink flow path 503 side. Therefore, in this comparative example, the ink flow path width was formed to 19 µm, and the wall width between the ink flow paths 503 was formed to 2 µm.

The ink jet recording head was produced similarly to Example 1 except that the ink flow path width was formed to the above-mentioned dimension and the groove pattern 10 was changed to the above-mentioned recess 521 divided for each ejection orifice.

When the sectional shape of the ejection orifice of the ink jet recording head produced in this comparative example was observed, there were a part in which the shape was deformed and a part unbonded to the substrate in the wall between adjacent ink flow paths 503 in the flow path forming member 504.

According to the present invention, it is possible to provide the method of manufacturing a liquid ejection head having a small flow resistance from the ejection energy generating element to the opening of the ejection orifice and an excellent adhesiveness between the flow path forming member and the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-087360, filed Apr. 6, 2012, which is hereby incorporated by reference herein in its entirety.

What is claimed is:

1. A method of manufacturing a liquid ejection head, the liquid ejection head comprising:
   a substrate including, at a first surface side thereof, a plurality of ejection energy generating elements for generating energy for ejecting liquid droplets; and
   a flow path forming member provided at the first surface side of the substrate, the flow path forming member forming a plurality of ejection orifices for ejecting the liquid droplets,
   the plurality of ejection energy generating elements being arranged in at least one row at the first surface side of the substrate,
   the plurality of ejection orifices being formed at positions corresponding to the plurality of ejection energy generating elements, respectively,
   the plurality of ejection orifices each having a tapered shape in which a cross-sectional area thereof decreases from an inner opening toward an outer opening,
   the method comprising, in the following order:
   (1) disposing a negative resist on or above the substrate to form a negative photosensitive resin layer;
   (2) forming, on or above a surface of the negative photosensitive resin layer, a hollow having inclinations at both sides in a cross section taken along a plane perpendicular to a row direction of the plurality of ejection orifices, the hollow being formed along a row direction of the plurality of ejection energy generating elements at a position on the surface of the negative photosensitive resin layer so as to extend over the plurality of ejection orifices, the position corresponding to a row of the plurality of ejection energy generating elements;

(3) performing exposure treatment to form a latent image of each of the plurality of ejection orifices in the hollow, the latent image being formed of an unexposed portion; and (4) performing development treatment to remove the unexposed portion, to thereby form the plurality of ejection orifices, wherein the latent image has a front surface portion disposed in the hollow so that an end portion of the front surface portion of the latent image is positioned in the inclinations at the both sides, and wherein an angle between a side surface portion of the latent image and a normal to the front surface portion in a cross section of the latent image taken along a plane which passes through a center of the latent image and is perpendicular to the row direction of the plurality of ejection orifices is larger than an angle between the side surface portion and the normal to the front surface portion in a cross section of the latent image taken along a plane which includes a center line of the latent image in the row direction of the plurality of ejection orifices and is perpendicular to a substrate surface.

2. The method of manufacturing a liquid ejection head according to claim 1, wherein the angle between the side surface portion and the normal to the front surface portion in the cross section of the latent image taken along the plane which passes through the center of the latent image and is perpendicular to the row direction of the plurality of ejection orifices is larger than an angle between the side surface portion and the normal to the front surface portion in each of all cross sections of the latent image taken along planes which are perpendicular to the substrate surface and are along the row direction of the plurality of ejection orifices.

3. The method of manufacturing a liquid ejection head according to claim 1, wherein, in a cross section of the latent image taken along a plane parallel to the substrate surface, the front surface portion has a circular shape, and a rear surface portion of the latent image has an elliptical shape.

4. The method of manufacturing a liquid ejection head according to claim 1, wherein the hollow has a catenary shape in the cross section taken along the plane perpendicular to the row direction of the plurality of ejection orifices.

5. The method of manufacturing a liquid ejection head according to claim 4, wherein the step (3) comprises performing the exposure treatment under a state in which a center of the front surface portion of the latent image is positioned at a deepest portion of the hollow.

6. The method of manufacturing a liquid ejection head according to claim 4, wherein a deepest portion of the hollow has a constant depth in a formation region of a row of the plurality of ejection orifices.

7. The method of manufacturing a liquid ejection head according to claim 1, wherein the step (2) comprises providing the hollow in a manner corresponding to each of the plurality of ejection orifices.

8. The method of manufacturing a liquid ejection head according to claim 1, wherein the step (2) comprises exposing the negative photosensitive resin layer with light to form an exposure pattern including the unexposed portion and then performing heat treatment, to thereby form the hollow in the front surface portion of the exposure pattern.

9. The method of manufacturing a liquid ejection head according to claim 8, wherein the heat treatment is performed at a temperature equal to or higher than a softening point of the negative resist.

10. The method of manufacturing a liquid ejection head according to claim 1, wherein the step (2) comprises forming the hollow by an imprint method.

11. The method of manufacturing a liquid ejection head according to claim 1, wherein, in a cross section of the hollow taken along a plane which passes through a center of corresponding one of the plurality of ejection orifices and is perpendicular to the row direction of the plurality of ejection orifices, a distance between an end portion of the hollow and an end portion of the corresponding one of the plurality of ejection orifices is 4 µm or more.

12. The method of manufacturing a liquid ejection head according to claim 1, wherein the hollow has a region in which a depth of the hollow is constant in a formation region of a row of the plurality of ejection orifices and the region extends over at least two ejection orifices.

* * * * *